United States Patent
Chen et al.

(10) Patent No.: US 6,700,178 B2
(45) Date of Patent: Mar. 2, 2004

(54) PACKAGE OF A CHIP WITH BEVELED EDGES

(75) Inventors: Jian-Cheng Chen, Tainan Hsien (TW); Wei-Min Hsiao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 223 days.

(21) Appl. No.: 09/838,752

(22) Filed: Apr. 19, 2001

(65) Prior Publication Data

US 2002/0125557 A1 Sep. 12, 2002

(30) Foreign Application Priority Data

Mar. 9, 2001 (TW) .................................. 90105525 A

(51) Int. Cl.[7] .............................................. H01L 23/48
(52) U.S. Cl. ...................... 257/618; 257/686; 257/723; 257/777
(58) Field of Search ................................ 257/686, 723, 257/725, 717, 618, 620, 623

(56) References Cited

U.S. PATENT DOCUMENTS 6,049,124 A * 4/2000 Raiser et al. ................ 257/712

* cited by examiner

Primary Examiner—David L. Talbott
Assistant Examiner—Lourdes Cruz
(74) Attorney, Agent, or Firm—J.C. Patents

(57) ABSTRACT

A chip with beveled edges suitable for adhering onto a surface of a die pad by an adhesive material. The chip has an active surface and a corresponding back surface, wherein the active surface has beveled edges. The back surface of the chip is adhered onto the surface of the die pad by the adhesive material.

10 Claims, 2 Drawing Sheets

PACKAGE OF A CHIP WITH BEVELED EDGES

CROSS-REFERENCE TO RELATED APPLICATION

This application claims the priority benefit of Taiwan application serial no. 90105525, filed on Mar. 9, 2001.

BACKGROUND OF THE INVENTION

1. Field of Invention

The present invention relates generally to a semiconductor package. More particularly, the present invention relates to a package of a chip with beveled edges.

2. Description of the Related Art

In semiconductor packaging, an attaching process for chips is a necessary step in the packaging fabrication. The attaching process comprises attaching a chip onto a carrier. A conventional package comprises a die pad on the carrier, which can allow the chip to adhere onto the carrier by utilizing an adhesive material. The adhesive material is usually filled in between the chip and the carrier as well as the sides of the chip in order to ensure the adhesive bonding between the chip and the carrier.

FIG. 1 illustrates a schematic view of a conventional package. A carrier, such as a lead frame, is first provided and is used to carry a chip 104. In a packaging structure of a lead frame for a single chip, for example, the carrier has a plurality of leads (not shown) and a die pad 106. A back surface of the chip 104 is adhered onto the die pad 106 by an adhesive material 102 such as epoxy or silver paste. In the process of adhering the chip 104 onto the die pad 106, a region 110 of the die pad will be filled with the adhesive material 102 first before adhering the back surface of the chip onto the die pad 106. The next step of the adhesive process comprises adhering one side of the chip 104 first, then lowering down the chip 104 gradually so that the chip 104 is adhered parallel to the die pad 106. The purpose of this step is to prevent air or a void from occurring in between the chip and the die pad; thus the bonding ability of the chip and the die pad is increased. In order to ensure the bond ability between the chip and the die pad, a region 102a, which is located at both sides of the chip, is filled with the adhesive material 102. A preferable thickness of the adhesive material in the region 110, which is between 0.5 mm to 2 mm, is required to provide sufficient adhesive bonding for the chip and the die pad.

However, the adhesive material 102 often exceeds the edges of the chip. Due to surface tension, the adhesive material 102 will flow along the sides 112 of the chip 104 to its top surface, such as an active surface 114, of the chip 104. As a result, the active surface of the chip is polluted by the adhesive material. With the development of the semiconductor package, the size of the chip has been decreasing. Because of the decrease in the size of the chip, the pollution problem on the active surface of the chip is even more serious. Therefore, a packaging method is needed to prevent the active surface of the chip from being polluted.

SUMMARY OF THE INVENTION

It is an object of the present invention to provide a chip with beveled edges, which is suitable for adhering onto a die pad by an adhesive material. The chip with beveled edges comprises an active surface and a back surface, wherein the edges of the active surface are beveled. The back surface of the chip is adhered onto the surface of the die pad with adhesive material. The adhesive material preferably covers the whole surface of the chip is in a range of 30° to 60°, but is preferably 45°.

It is another object of the present invention to provide a package of a semiconductor device, which comprises a carrier, a chip, an adhesive material, wires and a molding compound. The carrier has a die pad and a plurality of leads. The chip has an active surface and a corresponding back surface, and the active surface has beveled surfaces on both of its edges. The back surface of the chip is covered with adhesive material, and both sides of the chip are covered with adhesive material. The wires electrically connect the leads of the carrier to the active surfaces of the chips. The molding compound covers the chips, wires and portions between the carrier and the chips in order to allow the chip to be isolated from the outside environment.

Both the foregoing general description and the following detailed description are exemplary and explanatory only and are not restrictive of the invention, as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The present invention provides a method of fabricating a chip with beveled edges. It is an object of the present invention to provide a design of a chip that can prevent pollution of an active surface of the chip, which can be caused by an adhesive material adhering onto the active surface when excess adhesive material is applied on the chip.

Figure 1:
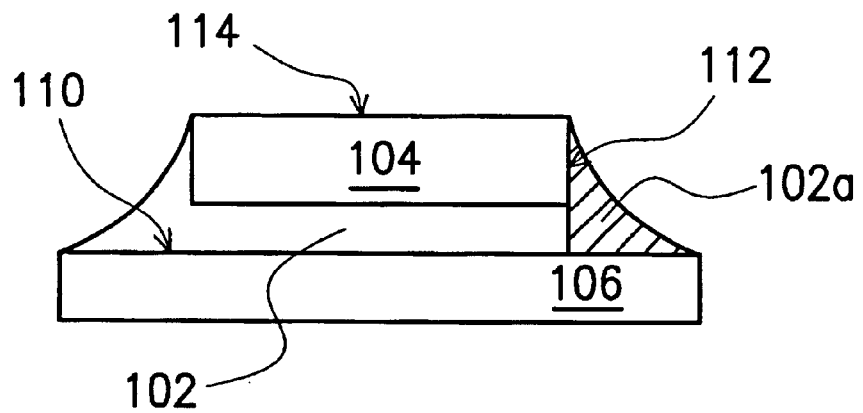
FIG. 1 is a schematic view of a conventional package.
Figure 2:
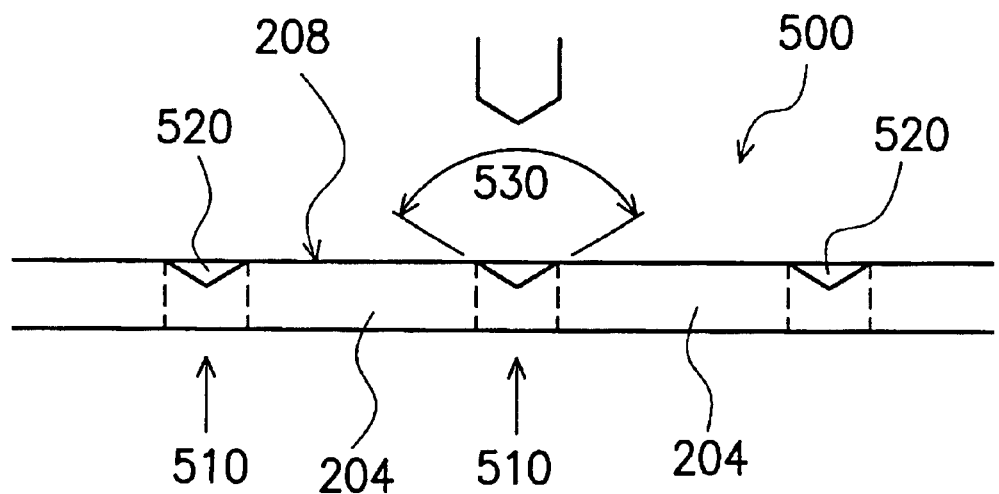
FIG. 2 is a schematic view of a chip with beveled edges of the present invention.

Referring to FIG. 2, a wafer 500, which is provided, has a plurality of chips 204. Each chip 204 is separated by a trench 510, which has a V-shaped opening 520. A method of fabricating the V-shaped opening 520 comprises a technique of utilizing a V-shaped blade to cut the opening, wherein an angle 530 of the V-shaped opening is in a range of 60° to 120°, but is preferably at 90°.

Next, the cutting machine is adjusted to the V-shaped opening to perform a singulation so that each chip can be separated to form a plurality of individual chips with beveled edges. The singulation process includes using a cutting blade to carry out the cutting process.

Figure 3:
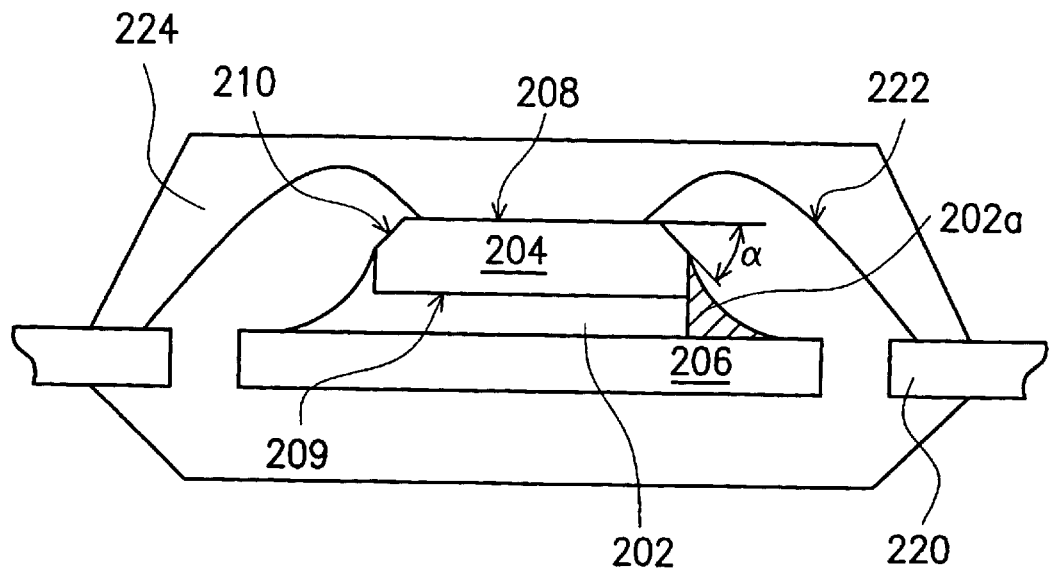
FIG. 3 is a schematic view of a semiconductor package in accordance with a first preferred embodiment of the present invention.

Referring to FIG. 3, after the singulation process, each chip 204 has an active surface 208 and a back surface 209, wherein the active surface 208 has a beveled edge 210 located on both sides of its top surface. The beveled edge 210 is created by the V-shaped blade during the singulation process. An angle α is in between the beveled edge 210 of the chip 204 and the active surface 208 of the chip and is in a range of 30° to 60° measured from a clockwise direction, but is preferably 45°.

The back surface 209 of the chip 204 is adhered onto a surface of a carrier such as a die pad 206 by an adhesive material 202, which covers the back surface 209 of the chip 204 to the edges of the chip 204. Thus a region 202a, which is shown in FIG. 3, is filled with the adhesive material 202, wherein the region 202a is just below the beveled edge chip 204 to the edges of the chip 204. Thus a region 202a, which is shown in FIG. 3, is filled with the adhesive material 202, wherein the region 202a is just below the beveled edge 210 of the chip 204. The adhesive material 202 comprises epoxy and silver paste.

The design of the beveled edges 210 of the chip 204 prevent the adhesive material 202 from adhering onto the active surface 208 when the adhesive material is applied to the back surface 209 of the chip 204. If the chip does not have beveled edges, the adhesive material 202 will flow to the active surface of the chip due to surface tension. Therefore, when the chip has beveled edges, the adhesive material will not be able to move up to the surface of the beveled edge 210 because the force of the surface tension is not enough to overcome the resistance force created by the surface of the beveled edge. Thus the design of the beveled edges of the chip achieves the object of keeping the active surface of the chip clean.

A wire bonding process is carried out to electrically connect a plurality of nodes of a carrier by utilizing a plurality of wires 222. The carrier can be a lead frame, which is used as an example in the preferred embodiment of the present invention. However, the scope of the present invention is not limited to types of carriers used such as the lead frame. A plurality of bonding pads (not shown) of the chip 204 are electrically connected to leads 220 by the wires 222. The wires are made of materials comprising gold and aluminum. An encapsualting process is performed to cover the chip 204, the wires 222 and a portion of the leads 220 by a molding compound 224. The molding compound 224 comprises epoxy.

Figure 4:
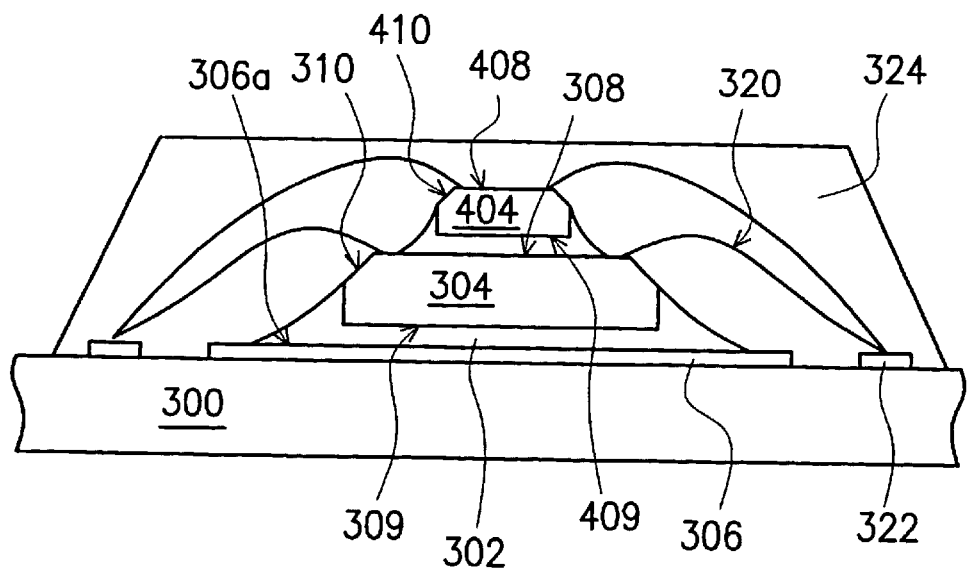
FIG. 4 is a schematic view of a multi-chip package in accordance with a second preferred embodiment of the present invention.

FIG. 4 illustrates a second preferred embodiment of the present invention. This embodiment is utilized on a multi-chip package with the same principle that is applied in the previous embodiment. A packaging structure comprising two chips is used as an example to describe the second embodiment. However, the scope of the present invention is not limited to the number of chips.

A carrier 300, such as a substrate, is firstly provided. The carrier 300 comprises a die pad 306 that can locate chips 304, 404. The first chip 304 has beveled edges 310. A back surface 309 of the first chip 304 is adhered onto a surface 306a of the die pad 306 by an adhesive material 302. To ensure that the first chip 304 is adhered properly onto the die pad 306, the adhesive material is filled into a region 306a, which extends outside of the back surface 309 of the chip 304. The first chip has beveled edges to prevent the excess adhesive material from flowing to an active surface 308 of the first chip 304.

From the above-mentioned method, a second chip 404 also has beveled edges, wherein an angle of the beveled edges can be different from or the same as that of the first chip 304. The second chip 404 has an active surface 408 and a back surface 409, which is adhered onto the active surface 308 of the first chip 304 by the adhesive material 302. To ensure the second chip 404 is adhered properly onto the first chip 304, the adhesive material is filled on the active surface 308 of the first chip 304, which is larger than the second chip 404. The second chip 404 also has beveled edges to prevent the excess adhesive material from flowing to its active surface 408. Thus the active surface 408 of the second chip 404 remains clean.

Wire bonding is performed to electrically connect the first chip 304 to the second chip 404 and the first chip 304 to the carrier 300. The wires 320 electrically connect the first chip 304 and the second chip 404 to a plurality of leads of the carrier 300, wherein the leads of the carrier 300 can be gold fingers 322 of the substrate, for example. The wires 320 are made of materials comprising gold and aluminum. An encapsulating process is carried out to cover the first chip 304, the second chip 404, the wires 222 and a portion of the surface of the carrier 300 with a molding compound 324. The molding compound 224 comprises epoxy.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A package of a semiconductor device, the package comprising:
    a carrier having a die pad and a plurality of leads;
    a chip, located on a surface of the die pad, wherein the chip has an active surface and a corresponding back surface that are connected to each other via a plurality of side surfaces, wherein the active surface has beveled edges;
    an adhesive material attaching the back surface of the chip to the surface of the die pad, wherein the adhesive material covers the whole back surface of the chip and the side surfaces of the chip, the beveled edges of the active surface preventing a coverage of the active surface by the adhesive material;
    a plurality of wires electrically connecting the leads of the carrier to the active surface of the chip; and
    a molding compound covering the chip, the wires and a portion of the leads.

2. The package of claim 1, wherein an angle between a beveled edge and the active surface of the chip is in a range of 30° to 60°.

3. The package of claim 1, wherein an angle between a beveled edge and the active surface of the chip is 45°.

4. The package of claim 1, wherein the adhesive material is epoxy.

5. The package of claim 1, wherein the adhesive material is silver paste.

6. A package of a semiconductor device, the package comprising:
    a carrier having a die pad and a plurality of leads;
    a plurality of chips, each chip having an active surface and a corresponding back surface that are connected to each other via a plurality of side surfaces, and the active surface has beveled edges, wherein the chips are stacked on one another on the die pad in such a manner that the active surface of one chip faces the back surface of one chip adjacently stacked thereon;

an adhesive material respectively attaching the chips to one another and to the die pad, wherein the adhesive material respectively covers the whole back surface and the side surfaces of the chips, the beveled edges preventing a coverage of the corresponding active surfaces by the adhesive material;

a plurality of wires, electrically connecting the leads of the carrier to the respective active surfaces of the chips; and a molding compound, covering the chips, the wires and a portion of the leads.

7. The package of claim 6, wherein an angle between a beveled edge and the active surface of the chip is in a range of 30° to 60°.

8. The package of claim 6, wherein an angle between a beveled edge and the active surface of the chip is 45°.

9. The package of claim 6, wherein the adhesive material is epoxy.

10. The package of claim 6, wherein the adhesive material is silver paste.

* * * * *